(12) United States Patent
Rozhavskaia

(10) Patent No.: US 11,901,483 B2
(45) Date of Patent: Feb. 13, 2024

(54) OPTOELECTRONIC SEMICONDUCTOR STRUCTURE COMPRISING A P-TYPE INJECTION LAYER BASED ON INGAN

(71) Applicant: Soitec, Bernin (FR)

(72) Inventor: Mariia Rozhavskaia, Grenoble (FR)

(73) Assignee: Soitec, Bernin (FR)

( * ) Notice: Subject to any disclaimer, the term of this patent is extended or adjusted under 35 U.S.C. 154(b) by 331 days.

(21) Appl. No.: 17/415,574

(22) PCT Filed: Dec. 26, 2019

(86) PCT No.: PCT/EP2019/087037
§ 371 (c)(1),
(2) Date: Jun. 17, 2021

(87) PCT Pub. No.: WO2020/144072
PCT Pub. Date: Jul. 16, 2020

(65) Prior Publication Data
US 2022/0093822 A1    Mar. 24, 2022

(30) Foreign Application Priority Data

Jan. 9, 2019    (FR) ...................... 1900190

(51) Int. Cl.
*H01L 33/06* (2010.01)
*H01L 33/12* (2010.01)
*H01L 33/00* (2010.01)

(52) U.S. Cl.
CPC .......... *H01L 33/06* (2013.01); *H01L 33/0075* (2013.01); *H01L 33/12* (2013.01)

(58) Field of Classification Search
CPC ..... H01L 33/06; H01L 33/0075; H01L 33/12; H01L 33/18; H01L 33/04; H01L 31/02008; H01L 31/035263; H01L 31/075
See application file for complete search history.

(56) References Cited

U.S. PATENT DOCUMENTS 8,643,037 B2 * 2/2014 Shim ........................ H01L 33/04
257/97
2002/0008243 A1  1/2002 Goetz et al.
(Continued)

FOREIGN PATENT DOCUMENTS

CN    101268547 A    9/2008
CN    102136536 A    7/2011
(Continued)

OTHER PUBLICATIONS

International Search Report for International Application No. PCT/EP19/087037 dated Mar. 20, 2020, 4 pages.
(Continued)

*Primary Examiner* — David Vu
(74) *Attorney, Agent, or Firm* — TraskBritt

(57) ABSTRACT

An optoelectronic semiconductor structure (SC) comprises an active InGaN-based layer disposed between an n-type injection layer and a p-type injection layer, the active p-type injection layer comprising a first InGaN layer and, disposed on the first layer, a second layer composed of a plurality of AlGaInN elemental layers, each elemental layer having a thickness less than its critical relaxation thickness, two successive elemental layers having different aluminum and/or indium and/or gallium compositions.

12 Claims, 1 Drawing Sheet

(56) References Cited

U.S. PATENT DOCUMENTS

| | | |
|---|---|---|
| 2012/0033444 A1 | 2/2012 | Moon et al. |
| 2012/0261687 A1 | 10/2012 | Shim et al. |
| 2013/0161586 A1 | 6/2013 | Okuno et al. |
| 2014/0110720 A1 | 4/2014 | Choi et al. |
| 2015/0221721 A1 | 8/2015 | Kawakami et al. |
| 2017/0092807 A1 | 3/2017 | Okuno |
| 2017/0133552 A1 | 5/2017 | Lai et al. |
| 2018/0277715 A1 | 9/2018 | Ma et al. |

FOREIGN PATENT DOCUMENTS

| | | |
|---|---|---|
| CN | 102292800 A | 12/2011 |
| CN | 102544285 A | 7/2012 |
| CN | 102185057 B | 11/2012 |
| CN | 107026223 A | 8/2017 |
| EP | 0215852 A1 | 9/1986 |
| EP | 0215856 B2 | 12/1993 |
| FR | 2992465 B1 | 3/2015 |
| KR | 10-2010-0070250 A | 6/2010 |
| WO | 1996/042114 A1 | 12/1996 |

OTHER PUBLICATIONS

International Written Opinion for International Application No. PCT/EP19/087037 dated Mar. 20, 2020, 5 pages.
Chinese Office Action for Application No. 201980090762.6 dated Oct. 12, 2023, 10 pages.

* cited by examiner

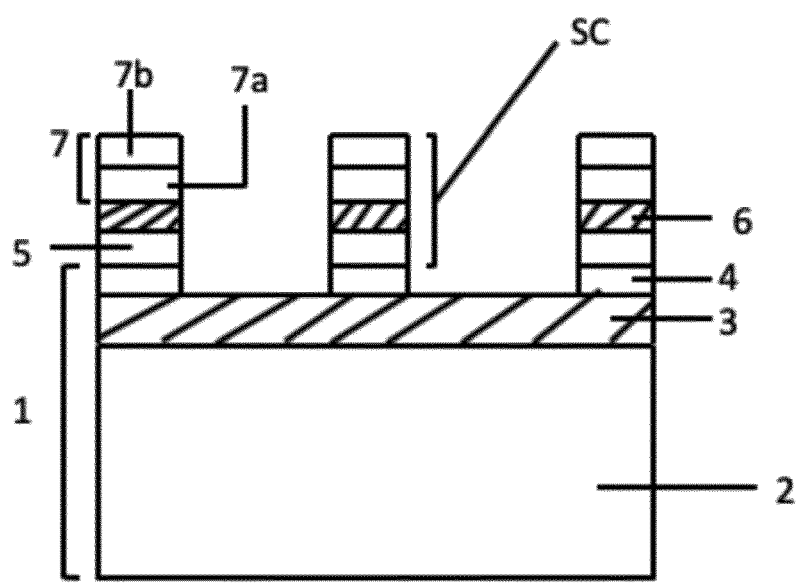

OPTOELECTRONIC SEMICONDUCTOR STRUCTURE COMPRISING A P-TYPE INJECTION LAYER BASED ON INGAN

CROSS-REFERENCE TO RELATED APPLICATIONS

This application is a national phase entry under 35 U.S.C. § 371 of International Patent Application PCT/EP2019/087037, filed Dec. 26, 2019, designating the United States of America and published as International Patent Publication WO 2020/144072 A1 on Jul. 16, 2021, which claims the benefit under Article 8 of the Patent Cooperation Treaty to French Patent Application Serial No. 1900190, filed Jan. 9, 2019.

TECHNICAL FIELD

The present disclosure concerns an optoelectronic semiconductor structure, such as a light-emitting diode (LED), a laser diode or a solar cell. It concerns, in particular, an optoelectronic semiconductor structure with a p-type injection layer made of InGaN.

BACKGROUND

An optoelectronic semiconductor structure is generally formed by a stack of crystalline semiconductor layers, including an active layer between an n-type injection layer and a p-type injection layer. In the case of an LED structure, the active layer can consist of an alternation of barrier layers and quantum well layers. To allow a homogeneous and dense flow of the current through the structure, the injection layers must be sufficiently thick, for example, above 200 nm.

In InGaN-based structures, the indium content of a quantum well layer can be in the order of 10% to form a diode emitting in blue, above about 20% when the diode emits in green, and above about 40% for a diode emitting in red. Barrier layers have a lower indium content than quantum well layers.

The higher the indium content, the more important is the natural lattice parameter (i.e., that of a layer that would be perfectly relaxed) of the quantum well layer. In other words, the higher the indium content, the more the quantum well layer is compressively strained when formed on a growth support with a specified lattice parameter.

Excessive strain in the stack forming an optoelectronic structure can lead to a defective structure. This strain can notably be at the origin of threading dislocations or pyramidal defects (often referred to as "V-pits" in this field) forming on the surface of the GaN or InGaN films that make up this structure. These defects deteriorate the functional performance of the optoelectronic structure.

To be less sensitive to this problem, documents EP215852 or EP215856 are known to describe manufacturing processes aimed at collectively forming semiconductor structures on superficial islands of InGaN of a growth support. For example, these islands may have an indium concentration of between 5% and 7% or more, and are at least partially relaxed.

The aim is to grow the n-type injection layer of InGaN on this growth support so that it keeps the lattice parameter of the material forming the surface of the growth islands. This reduces stresses in the active region of the semiconductor structure that is formed on the substrate, and promotes the incorporation of indium into the active layer and, more generally, improves the efficiency of the optoelectronic device.

However, the formation of a p-type injection layer in such an optoelectronic semiconductor structure is problematic.

When this p-type injection layer is made of GaN, the difference in lattice parameters with the active InGaN layer on which it rests imposes a high stress on the injection layer and can lead to cracks.

If the p-type injection layer consists of InGaN, particularly with an indium concentration greater than 10% or 15%, it must be formed at a relatively low temperature, which leads to poor material quality and high background concentration of donors, making it difficult to achieve required acceptor concentrations. Additionally, low acceptor concentration increases the resistance of p-contact and makes it difficult to realize ohmic contact. Increasing the concentration of dopant, for example Mg, to compensate for both these phenomena cannot be considered, as it leads to a deterioration of the crystalline quality of the layer. Studies have suggested that the formation of the p-type injection layer in the form of a super lattice could improve several times the average hole concentration of this layer as compared to its concentration in a single homogeneous layer of InGaN. However, such a super lattice is particularly complex and time-consuming to make up for a p-type injection layer, which must necessarily be thick.

BRIEF SUMMARY

The present disclosure aims to solve at least part of these problems. In particular, it aims to form an optoelectronic semiconductor structure comprising an InGaN p-type injection layer with satisfactory electrical properties and crystalline properties that can be preserved.

To reach this goal, the scope of this present disclosure proposes an optoelectronic semiconductor structure comprising an active InGaN-based layer disposed between an n-type injection layer and a p-type injection layer, the p-type injection layer comprising a first InGaN layer presenting a thickness ranging from 50 nm to 300 nm and, disposed on the first layer, a second layer composed of a plurality of AlGaInN elemental layers, each elemental layer having a thickness less than its critical relaxation thickness, two successive elemental layers having different aluminum and/or indium and/or gallium compositions.

According to other advantageous and non-restrictive characteristics of the present disclosure, taken either separately or in any technically feasible combination:
  the elemental layers all have a thickness between 1 nm and 30 nm;
  the plurality of elemental layers is formed by repeating a periodic structure composed of at least two elemental layers;
  the periodic structure is composed of a first elemental layer of InGaN and a second elemental layer of GaN, AlN or AlGaN;
  the periodic structure is composed of a first elemental layer of InGaN, the indium composition of the first elemental layer being different from one periodic structure to another;
  the second layer has a thickness ranging from 150 to 350 nanometers; and
  the p-type injection layer has a thickness of less than 400 nm.

BRIEF DESCRIPTION OF THE DRAWINGS

Other characteristics and advantages of the present disclosure will become apparent from the detailed description of the present disclosure that follows with reference to the attached FIG. 1, which represents an optoelectronic semiconductor structure according to the present disclosure, placed on a growth support.

FIG. 1 shows a plurality of optoelectronic semiconductor structures SC, in this case LEDs, arranged on a growth support 1.

DETAILED DESCRIPTION

The structure SC comprises an n-type injection layer 5, a p-type injection layer 7, and arranged between these two layers, an LED active layer 6.

Growth support 1 is an "islands" support, a detailed description of which can be found in the documents cited in the introductory part of the present disclosure. It therefore comprises a base substrate 2, for example sapphire, an intermediate layer 3 formed of a material or a plurality of dielectric materials, such as silicon dioxide or silicon nitride, and a plurality of at least partially relaxed growth islands 4.

In general, growth islands 4 are made of a material with the general formula AlInGaN and have a lattice parameter corresponding to the natural lattice parameter of an InGaN layer, with an indium content of between 5% and 40%.

In the example of FIG. 1, growth islands 4 consist of InGaN, with an indium content of 15%, and are 90% relaxed.

On growth islands 4, a plurality of SC semiconductor structures may be formed by conventional epitaxy techniques. These can be a metalorganic chemical vapor deposition (MOCVD) technique or a molecular beam epitaxy (MBE) technique.

A structure SC here is formed by an n-type injection layer 5 of InGaN, for example, doped with silicon in a concentration of the order of $10^{18}$ to $10^{19}$ cm$^{-3}$. Its indium concentration is approximately equal to that of the material constituting growth islands 4, around 13.5%, in order to match their lattice parameters or keep the n-type injection layer 5 under slight tensile strain. The thickness of this layer ranges, typically, from 200 nm to 400 nm.

In an alternative to the example shown in FIG. 1, the n-type injection layer 5 can be made as a super lattice. This may involve a plurality of very thin elementary layers of AlInGaN, with a thickness of less than a few tens of nanometers, for example, 30 nm, and of different natures. Thus, n-type injection layer 5 may be formed by repeating a periodic structure comprising a first elementary layer of InGaN and a second elementary layer of GaN, AlN, or AlGaN. The elementary layers all have a thickness less than their critical relaxation thickness.

The proportions of aluminum, indium and gallium and the thicknesses of each layer making up the super lattice shall be chosen so that the layer of corresponding homogeneous composition has a natural lattice parameter substantially equivalent to the lattice parameter of growth islands 4. In other words, the lattice parameter of the n-type injection layer 5, as measured by XRD, corresponds to the lattice parameter of the growth islands. As in the case of a homogeneous injection n-type layer 5, the stresses that accumulate in the semiconductor structure during its growth are thus limited.

Returning to the description of FIG. 1, the optoelectronic semiconductor structure SC also includes, on the n-type injection layer 5, an active layer 6. This layer is formed by a plurality of alternating InGaN barrier layers and quantum well layers. The barrier layers have a concentration of indium similar to that of the n-type injection layer 5, in this case around 13.5%. InGaN quantum well layers have an indium concentration chosen according to the desired emission wavelength. In the example shown, this concentration is 25%.

More generally, the active layer is InGaN based. The quantum well layers may be made of InGaN presenting a first indium concentration, and the barrier layers may be made of InGaN presenting a second indium concentration, lower than the first concentration. The barrier layer may also be made of GaN or AlGaN, but the present disclosure is preferably directed to an active layer where both the quantum well layers and the barrier layers are made of InGaN. Also, thin intermediate layers, for instance, made of AlGaN, may be inserted between the barrier and quantum well layers.

On active layer 6, the semiconductor structure SC has a p-type injection layer 7.

This p-type injection layer 7 is composed of a first layer 7a made up of p-doped InGaN, for example, incorporating a concentration of Mg of about $10^{20}$ cm$^{-3}$. This first layer 7a has, typically, a thickness of between 50 and 350 nm. The lattice parameter of this layer is aimed to match that of the stack on which it is formed, or to place the layer in slight tensile stress. In a very general way, the indium concentration of this first layer 7a corresponds to that of the n-type injection layer 5, here on the order of 13.5%

To increase acceptor concentration and improve the conductivity and the quality of the ohmic contact of the p-type injection layer 7, a second layer 7b may be formed on this first layer 7a.

This second layer 7b is formed of elementary layers made of a material whose general formula is InAlGaN. These elementary layers have thicknesses chosen, depending on their nature, to be less than the critical thickness beyond which defects (cracks, pyramidal defects) are likely to form. Typically, the elementary layers have a thickness between 1 and 30 nanometers. Of course, two successive elementary layers have different aluminum and/or indium and/or gallium compositions, which make it possible to define and distinguish them. The second layer can be under the compressive or tensile stress.

The elementary layers are doped, at least for a majority of them, in such a way as to give the second layer p-type electrical properties. It can be a doping of Mg in a concentration between $10^{19}$ and $10^{22}$ per cm$^3$.

The general shape of the p-type injection layer 7 described above is advantageous for several reasons.

First, the second layer 7b has no or very few (compared to the first layer 7a) structural defects such as cracks or pyramidal defects. The multiplicity of overlapping elementary layers also limits the effects that residual defects could cause during wet processing that the layer could undergo. This protects the semiconductor structure from liquid agents that are sometimes required to be applied to produce functional devices. In particular, it is possible, for example, to treat the semiconductor structures in FIG. 1 with a liquid solution of KOH to deoxidize the surfaces before depositing metal studs forming electrical contacts on the p-type layer.

In addition, studies presented briefly in the introduction to this present disclosure have shown that the generation of hole-type carriers in the layer formed by a plurality of doped elementary layers just described is much more effective than in a homogeneous layer.

The second layer 7b, therefore, confers to this part of the p-type injection layer electrical characteristics that are particularly interesting. However, it is not necessary for the entire p-type injection layer to consist of such elementary layers, and it is therefore expected that part of this injection layer, the first layer 7a, will consist of a single layer of InGaN.

This facilitates the fabrication of the semiconductor structure by avoiding unnecessary repetitions of elementary layers.

Thus, the thickness of the first layer 7a can be between 50 and 300 nanometers, and the thickness of the second layer 7b, i.e., the combined thickness of the elementary layers, between 100 and 350 nanometers. As such, a sufficient number of elementary layers, whose individual thicknesses are limited so as not to exceed their respective critical thickness, shall be provided to form a second layer of selected thickness. Generally speaking, the p-type injection layer has preferably a total thickness of less than 400 nm, and ranges from 200 nm to 400 nm.

To facilitate the design and manufacture of the second layer 7b, the plurality of elementary layers can be formed by repeating a periodic structure composed of at least two elementary layers. This periodic structure is formed successively and repeatedly on the first layer 7a, a number of times sufficient to form the second layer of the chosen thickness.

This allows for a periodic structure consisting of a first elemental layer of InGaN and a second elemental layer of GaN, AlN with thicknesses less than 2 nm in order to avoid cracking, or AlGaN with an aluminum composition of less than 20% for the same reasons of avoiding cracking and avoiding degrading conductivity of the layer.

The indium concentration in the first InGaN elemental layer of the periodic structure is not necessarily constant from one periodic structure to another in the second layer 7b. It may be considered to increase or decrease this concentration from an initial concentration value of the first elemental layer closest to the first layer 7a. In this way, a second layer 7b is formed corresponding to a homogeneous layer of InGaN with an indium concentration gradient.

The periodic structure can also include more than two elemental layers. For example, a periodic structure consisting of a stack of elemental layers of InGaN, GaN and AlGaN can be provided.

Whatever the exact nature of the second layer 7b of the p-type injection layer 7, it has a higher hole concentration than would be present in a homogeneous InGaN layer and has a reduced through-type defect density, thus forming a high-quality injection layer and high quality ohmic contact.

Of course, the present disclosure is not limited to the described embodiments and variations may be made without departing from the scope of the invention as defined by the claims.

In particular, the optoelectronic semiconductor structure SC may comprise additional layers beyond the described active layer 6, n-type injection layer 5 and a p-type injection layer 7. For instance, the optoelectronic semiconductor structure may comprise an electron blocking layer disposed between the active layer and the p-type injection layer, as this is very well known in the art. Such electron blocking layers may be formed of a thin layer (i.e., typically, 20 nm) with an indium concentration lower than the indium concentration in the first InGaN layer 7a.

Although a growth medium has been presented here in the form of an island medium, it could be a medium of any other nature that allows the growth of an InGaN-based optoelectronic semiconductor structure.

The invention claimed is:

1. An optoelectronic semiconductor structure comprising an active InGaN-based layer disposed between an n-type injection layer and a p-type injection layer, the p-type injection layer comprising a first InGaN layer having a thickness ranging from 50 nm to 300 nm and, disposed on the first InGaN layer, a second layer composed of a plurality of AlGaInN elemental layers, each elemental layer having a thickness less than its critical relaxation thickness, two successive elemental layers having different aluminum and/or indium and/or gallium compositions.

2. The semiconductor structure of claim 1, wherein the elemental layers all have a thickness between 1 nm and 30 nm.

3. The semiconductor structure of claim 2, wherein the plurality of AlGaInN elemental layers comprises a repeating periodic structure composed of at least two elemental layers.

4. The semiconductor structure of claim 3, wherein the repeating periodic structure is composed of a first elemental layer of InGaN and a second elemental layer of GaN, AlN or AlGaN.

5. The semiconductor structure of claim 3, wherein the repeating periodic structure is composed of a first elemental layer of InGaN, the indium composition of the first elemental layer being different from one periodic structure to another.

6. The semiconductor structure of claim 4, wherein the second elemental layer RIO has a thickness ranging from 150 to 350 nanometers.

7. The semiconductor structure of claim 3, wherein the p-type injection layer has a thickness of less than 400 nm.

8. The semiconductor structure of claim 1, wherein the plurality of AlGAInN elemental layers comprises a repeating periodic structure composed of at least two elemental layers.

9. The semiconductor structure of claim 8, wherein the repeating periodic structure is composed of a first elemental layer of InGaN and a second elemental layer of GaN, AlN or AlGaN.

10. The semiconductor structure of claim 9, wherein the repeating periodic structure is composed of a first elemental layer of InGaN, the indium composition of the first elemental layer being different from one periodic structure to another.

11. The semiconductor structure of claim 9, wherein the second elemental layer has a thickness ranging from 150 to 350 nanometers.

12. The semiconductor structure of claim 1, wherein the p-type injection layer has a thickness of less than 400 nm.

* * * * *

UNITED STATES PATENT AND TRADEMARK OFFICE
CERTIFICATE OF CORRECTION

PATENT NO. : 11,901,483 B2
APPLICATION NO. : 17/415574
DATED : February 13, 2024
INVENTOR(S) : Mariia Rozhavskaia It is certified that error appears in the above-identified patent and that said Letters Patent is hereby corrected as shown below:

In the Claims
Claim 6, Column 6, Line 34, change "layer RIO has a" to --layer has a--
Claim 8, Column 6, Line 39, change "plurality of AlGAInN elemental" to --plurality of AlGaInN elemental--

Signed and Sealed this
Second Day of April, 2024

Katherine Kelly Vidal
*Director of the United States Patent and Trademark Office*